United States Patent
Dong

(10) Patent No.: US 8,469,313 B2
(45) Date of Patent: Jun. 25, 2013

(54) AERODYNAMIC STRUCTURE HAVING A RIDGED SOLAR PANEL AND AN ASSOCIATED METHOD

(75) Inventor: Jian Dong, Irvine, CA (US)

(73) Assignee: The Boeing Company, Chicago, IL (US)

( * ) Notice: Subject to any disclaimer, the term of this patent is extended or adjusted under 35 U.S.C. 154(b) by 204 days.

(21) Appl. No.: 12/706,287

(22) Filed: Feb. 16, 2010

(65) Prior Publication Data

US 2011/0198444 A1 Aug. 18, 2011

(51) Int. Cl.
*B64C 1/38* (2006.01)

(52) U.S. Cl.
USPC ............... 244/130; 244/200; 244/123.1

(58) Field of Classification Search
USPC ............ 244/200, 119, 123.1, 24, 30, 198, 244/130, 136
See application file for complete search history.

(56) References Cited

U.S. PATENT DOCUMENTS

| | | | | |
|---|---|---|---|---|
| 4,706,910 | A | * | 11/1987 | Walsh et al. ............... 244/130 |
| 2009/0200417 | A1 | * | 8/2009 | Mitchell .................... 244/30 |
| 2010/0282909 | A1 | * | 11/2010 | Rawlings et al. ........... 244/130 |
| 2011/0186685 | A1 | * | 8/2011 | Tsotsis et al. .............. 244/130 |

FOREIGN PATENT DOCUMENTS

| | | |
|---|---|---|
| EP | 1 306 907 A1 | 5/2003 |
| JP | 4 005198 A | 1/1992 |
| WO | WO 2008/098051 A2 | 8/2008 |

OTHER PUBLICATIONS

Gerhards, C. et al., *Mechanical Microtexturization for Multicrystalline SI Solar Cells*, 16th EPVSEC, Glasgow, UK (2000), 4 pages.
Machida, T. et al., *Efficiency Improvement in Polycrystalline Silicon Solar Cell With Grooved Surface*, IEEE 1991, pp. 1033-1034.
Riblets, www.newplanetech.com/riblets.pdf, (2008-2009), 8 pages.
International Search Report and Written Opinion for Application No. PCT/US2011/021759 dated Jan. 19, 2012.

* cited by examiner

*Primary Examiner* — Christopher P Ellis
*Assistant Examiner* — Medhat Badawi
(74) *Attorney, Agent, or Firm* — Alston & Bird LLP

(57) ABSTRACT

Air vehicles and associated aerodynamic structures are provided which include ridged solar panels to both reduce the drag and increase the solar energy harvested by the solar panel. The air vehicle may include an airframe and a solar panel carried by the airframe and defining an exterior surface thereof. The solar panel may include a plurality of ridged structures extending in a lengthwise direction. The ridged structures may be arranged such that a majority of the airflow over the exterior surface flows in the lengthwise direction. The plurality of ridged structures may include a plurality of lengthwise extending projections spaced about by respective valleys.

26 Claims, 2 Drawing Sheets

2

AERODYNAMIC STRUCTURE HAVING A RIDGED SOLAR PANEL AND AN ASSOCIATED METHOD

TECHNOLOGICAL FIELD

Embodiments of the present disclosure relate generally to air vehicles and associated aerodynamic structures and, more particularly, to air vehicles and associated aerodynamic structures having solar panels for the generation of electrical energy.

BACKGROUND

With rising fuel costs, there are increasing demands being placed upon aircraft to be more fuel efficient, that is, to go at least as far or further while consuming the same amount or less fuel. By becoming more fuel efficient, the costs associated with the fuel consumption of a fleet of aircraft would be reduced, and the impact upon the environment would be correspondingly decreased. Additionally, a more fuel efficient aircraft carrying the same amount of fuel could carry a greater payload and/or have a greater mission range or time. In order to construct aircraft having improved fuel efficiency, a variety of techniques to reduce the drag and therefore increase the fuel efficiency of an aircraft have been studied and, in some instances, implemented.

Another technique considered in regard to increasing the fuel efficiency of aircraft and reducing the dependence of an aircraft upon fossil fuels has relied upon the harvesting of solar energy and the utilization of solar energy to at least partially power aircraft. In this regard, the incorporation of solar cells upon the exterior surfaces of aircraft has been considered. However, the solar cells generally disadvantageously increase the weight and the drag of the aircraft and correspondingly reduce the fuel efficiency of the aircraft, notwithstanding the gains attributable to the harvesting of solar energy by the solar cells. Additionally, the relatively low energy conversion efficiency and the relatively high surface area to power output ratio of solar cells has also limited their utilization as an alternative energy source for aircraft.

As such, it would be desirable to develop more fuel efficient aircraft which rely, at least to some degree, upon the collection of solar energy, thereby potentially decreasing operational costs and the impact upon the environment.

BRIEF SUMMARY

Air vehicles and associated aerodynamic structures that may be more fuel efficient are provided in accordance with embodiments of the present disclosure. In this regard, the air vehicle, aerodynamic structure and associated method of embodiments of the present disclosure may include ridged solar panels to both reduce the drag and increase the solar energy harvested by the solar panel. By reducing the drag and by increasing the electrical energy that may be generated from the solar energy collected by the solar panel, the air vehicle, aerodynamic structure and associated method of embodiments of the present disclosure may operate in a more fuel efficient manner.

In one embodiment, an air vehicle is provided that includes an airframe and a solar panel carried by the airframe and defining an exterior surface thereof. The solar panel includes a plurality of ridged structures extending in a streamwise direction. The ridged structures are arranged such that a majority of the airflow over the exterior surface flows in the streamwise direction. In this regard, the ridged structures may be arranged such that the streamwise direction is parallel to a predefined airflow direction. The plurality of ridged structures may include a plurality of streamwise or lengthwise extending projections spaced about by respective valleys. In one embodiment, the plurality of ridged structures may be identical.

The airframe may include a wing with the solar panel defining the exterior surface of an upper portion of the wing proximate a trailing edge of the wing. In another embodiment, the airframe includes a tail with the solar panel defining the exterior surface of an upper portion of the tail proximate a trailing edge of the tail. In a further embodiment, the airframe includes the fuselage with the solar panel defining the exterior surface of an upper portion of the fuselage.

In another embodiment, an aerodynamic structure is provided that includes an aerodynamic surface configured to support airflow in a predefined airflow direction and a solar panel defining a portion of the aerodynamic surface. The solar panel includes a plurality of ridged structures extending in the predefined airflow direction. The plurality of ridged structures may include a plurality of streamwise extending projections spaced apart by respective valleys. The plurality of ridged structures may, in one embodiment, be identical.

In one embodiment, the aerodynamic structure is a wing with the solar panel defining the exterior surface of an upper portion of the wing proximate the trailing edge of the wing. In another embodiment, the aerodynamic structure is a tail with the solar panel defining the exterior surface of an upper portion of the tail proximate the trailing edge of the tail. In a further embodiment, the aerodynamic structure is a fuselage with the solar panel defining the exterior surface of an upper portion of the fuselage.

In another embodiment, a method is disclosed that provides a solar panel carried by an airframe and defining an exterior surface of the airframe. According to the method of this embodiment, optical energy is received with the solar panel, and at least some of the optical energy is converted to electrical energy. In regard to the provision of the solar panel, a solar panel may be provided having a plurality of ridged structures extending in a streamwise direction and arranged such that the majority of airflow over the exterior surface flows in the streamwise direction. In one embodiment, the solar panel is provided that has ridged structures arranged such that the streamwise direction is parallel to a predefined airflow direction. The plurality of ridged structures may include a plurality of lengthwise extending projections spaced apart by respective valleys. In providing the solar panel, a solar panel may be provided in one embodiment with a plurality of identical ridged structures.

In one embodiment, the airframe is a wing such that the provision of the solar panel includes the provision of a solar panel that defines the exterior surface of an upper portion of the wing proximate the trailing edge of the wing. In another embodiment in which the airframe includes a tail, the provision of the solar panel includes the provision of a solar panel that defines the exterior surface of an upper portion of the tail proximate the trailing edge of the tail. In a further embodiment in which the airframe is a fuselage, the provision of the solar panel includes provision of a solar panel that defines the exterior surface of an upper portion of the fuselage.

The features, functions and advantages that have been discussed may be achieved independently in various embodiments of the present disclosure and may be combined in yet other embodiments, further details of which may be seen with reference to the following description and drawings.

BRIEF DESCRIPTION OF THE SEVERAL VIEWS OF THE DRAWING(S)

Having thus described embodiments of the present disclosure in general terms, reference will now be made to the accompanying drawings, which are not necessarily drawn to scale, and wherein:

DETAILED DESCRIPTION

The present disclosure now will be described more fully hereinafter with reference to the accompanying drawings, in which some, but not all embodiments are shown. Indeed, the present disclosure may be embodied in many different forms and should not be construed as limited to the embodiments set forth herein; rather, these embodiments are provided so that this disclosure will satisfy applicable legal requirements. Like numbers refer to like elements throughout.

Figure 1:
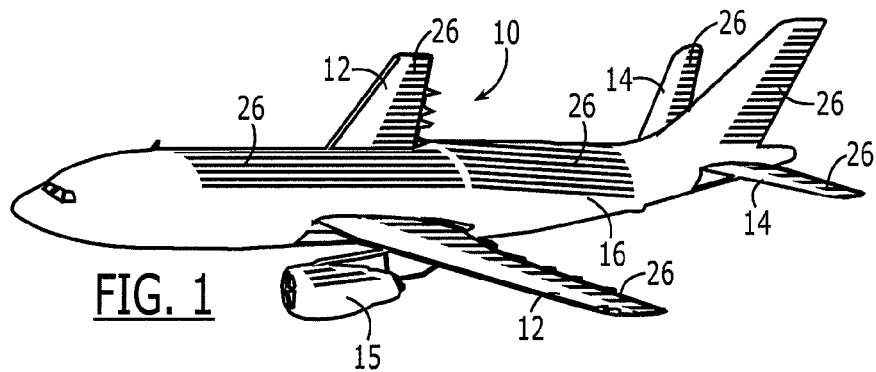
FIG. 1 is a perspective view of an aircraft having ridged solar panels on portions of a wing, a tail and the fuselage in accordance with embodiments of the present disclosure.

Referring to FIG. 1, an air vehicle 10 in accordance with one embodiment is illustrated. Although the air vehicle of the illustrated embodiment is an aircraft, a variety of other types of air vehicles may be employed in accordance with embodiments of the present disclosure, including missiles. Even with respect to aircraft, the aircraft of embodiments of the present disclosure may be widely varied, including both commercial and military aircraft and manned and unmanned aircraft.

An air vehicle 10 includes an airframe which, in turn, includes one or more aerodynamic structures, such as one or more airfoils. With respect to the aircraft of FIG. 1, each wing 12, each tail 14 and the fuselage 16 may not only comprise the airframe, but each is a distinct aerodynamic structure. In this regard, at least the wing and the tail serve as airfoils for directing airflow thereover. Each aerodynamic structure includes an aerodynamic surface configured to support airflow in a predefined airflow direction, such as in a direction extending from the forward end of the aircraft to the aft end of the aircraft. The predefined airflow direction is also known as the streamwise direction.

As shown in FIG. 1, the air vehicle 10 may also include a solar panel or a plurality of solar panels 26 carried by the airframe. The solar panel defines an exterior surface of the airframe, and, as such, will be exposed to solar energy as well as airflow over the airframe during flight of the air vehicle. In this regard, the solar panel therefore defines a portion of the aerodynamic surface of the corresponding aerodynamic structure. As shown in FIG. 1, each of the wings 12, tails 14, engine nacelles 15 and fuselage 16 may include solar panels that define a portion of the respective aerodynamic surface. As shown in FIG. 1 and, in more detail, in FIG. 2, in instances in which aerodynamic structure is an airfoil 20, such as a wing 12, the solar panel 26 may define the exterior surface of an upper portion of the wing. As such, the solar panel of the wing will be exposed not only to solar energy during flight, but also to the air flowing over the upper surface of the wing. Although the solar panel may define the entire exterior surface of the upper portion of the wing, the solar panel of one embodiment may only define the exterior surface of part of the upper portion of the wing with the exterior surface of the remainder of the upper portion of the wing being defined in a conventional manner, such as by the relatively smooth metallic or composite skin of an aircraft.

In one embodiment, the airflow over an airfoil 20 or other aerodynamic structure begins at the leading edge 22 as a laminar flow with the flow becoming turbulent in a medial portion of the aerodynamic structure and continuing as a turbulent flow to the trailing edge 24. The turbulent flow over an aerodynamic surface generally creates more drag than a laminar flow over the same aerodynamic surface. Since the solar panel 26 is configured to reduce drag, the solar panel of one embodiment defines a portion of the aerodynamic surface that would otherwise experience turbulent flow thereover, such as the portion of the aerodynamic surface proximate the trailing edge. For example, the solar panel may define a majority, or all, of the aerodynamic surface that would otherwise experience turbulent flow thereover. Conversely, the solar panel may, but need not, define any portion of the aerodynamic surface that experiences laminar flow thereover, such as the portion of the aerodynamic surface proximate the leading edge, since the capability of the solar panel to reduce drag is of less value than in those areas that otherwise experience turbulent flow. In one embodiment, the solar panels that define a portion of the wings may extend from the trailing edge of the respective airfoil in a lengthwise direction as defined by the chord line 25 of the airfoil to a medial portion of the airfoil so as to cover up to about 40% to 50% of the exterior surface of the airfoil, such as 40% to 50% of the exterior surface of the upper portion of the wings.

Figure 2:
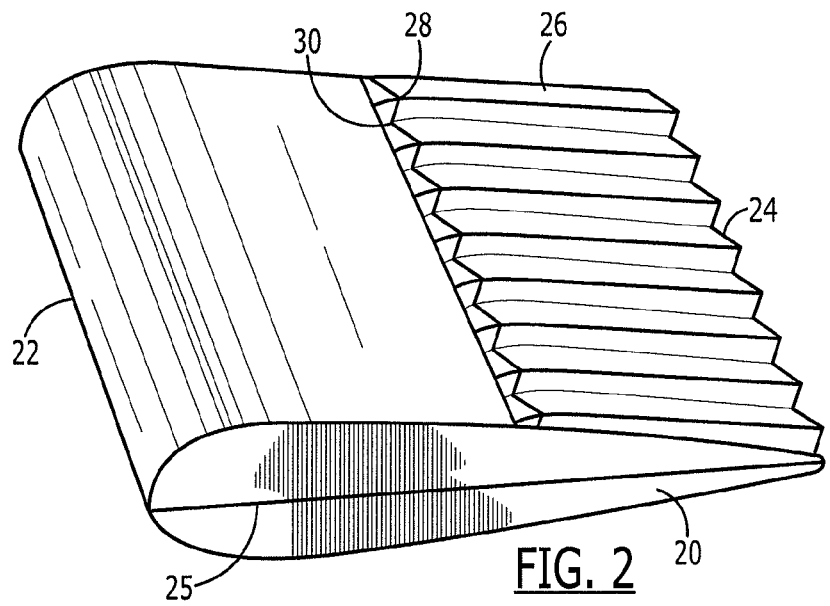
FIG. 2 is a fragmentary perspective view of a portion of a wing having a solar panel proximate the trailing edge in accordance with embodiments of the present disclosures.

In regard to the embodiment illustrated in FIGS. 1 and 2, the solar panel 26 defines the exterior surface of that part of the upper portion of the wing 12 that is proximate the trailing edge 24 of the wing. As shown in FIG. 2, for example, the solar panel may extend from the trailing edge of the wing to a medial portion of the wing in a lengthwise direction as defined by the chord line 25 of the wing, but not to the leading edge 22 of the wing.

As shown in FIG. 1, the tail 14, the engine nacelle 15 and the fuselage 16 may also include solar panels 26 on upper portions thereof. Although the solar panels that define the exterior surface of an upper portion of the horizontal tail and the fuselage may define the entire exterior surface of the upper portions of the horizontal tail and the fuselage, the solar panels may, in one embodiment, only define the exterior surface of a part of the upper portion of the tail and the fuselage. In the illustrated embodiment, for example, the solar panel that defines the exterior surface of an upper portion of the tail is proximate the trailing edge of the tail and extends forwardly in a lengthwise direction as defined by the chord line 25 of the tail to a medial portion of the tail, but not to the leading edge of the tail. As with the wing described above, the exterior surface of the horizontal tail that is defined by the solar panel may be up to 40% to 50% of the upper portion of the horizontal tail, but other embodiments may incorporate solar panels that define greater or lesser percentages of the upper portion of the horizontal tail. In regards to the vertical tail(s), the solar panels may similarly define up to 40% to 50% of the exterior surface of both sides of the vertical tail(s). As to the fuselage, the solar panels of one embodiment may define the exterior surface of the upper half of the generally tubular fuselage with the exception of the nose and the pilot window areas. Further, an engine nacelle of one embodiment may also include solar panels on the exterior surface of its upper half.

Figure 3:
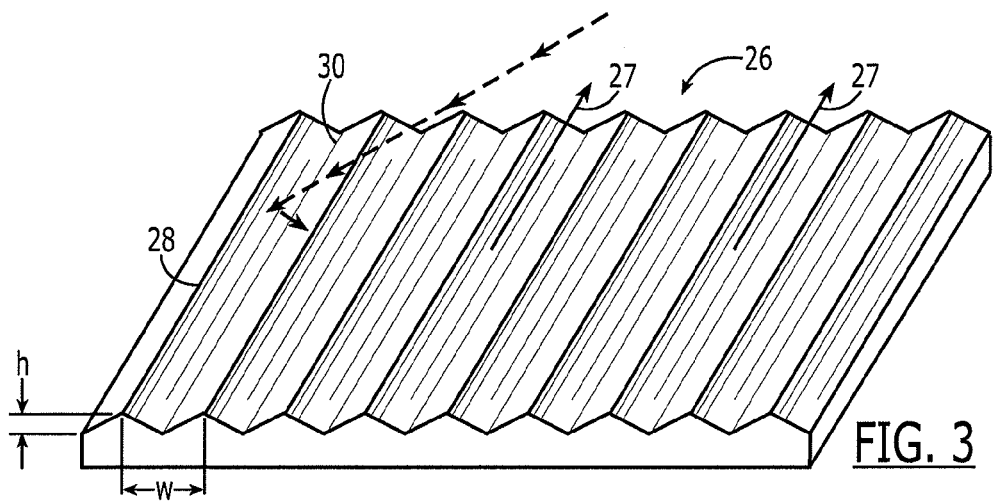
FIG. 3 is a perspective view of a solar panel in accordance with embodiments of the present disclosure.

A variety of different types of solar panels 26 may be carried by the airframe. The solar panels may be any surface devices that are configured to absorb solar energy and to facilitate the conversion of solar energy to electrical energy. For example, the solar panels may include solar cells, solar cell arrays, solar films or other solar energy materials that may be deposited upon an underlying structure, all of which are generically referred to as solar panels herein. The solar cells and the resulting solar panels may be formed of various materials including, for example, silicon (Si) solar cells or gallium arsenide/germanium (GaAs/Ge) solar cells. As shown in FIG. 3, the solar panel of one embodiment includes a plurality of ridged structures that define the exterior surface of an aerodynamic structure and which provide an aerodynamic surface texture. By forming the exterior surface of an aerodynamic structure, the ridged structure will be exposed to airflow over the aerodynamic surface that is at least partially defined by the solar panel. In order to facilitate the airflow, the plurality of ridged structures are arranged such that a majority of the airflow over the exterior surface will flow in the same lengthwise direction that the ridged structures extend, such as shown by arrows 27 of FIG. 3 which represent the airflow over the solar panel. Indeed, in one embodiment, the plurality of ridged structures extend parallel to or otherwise in the predefined airflow direction that air is anticipated to flow over the aerodynamic surface during flight. In other words, the plurality of ridged structures of one embodiment extend parallel to or otherwise in the same direction as the chord line 25 of the airfoil.

Figure 4A:
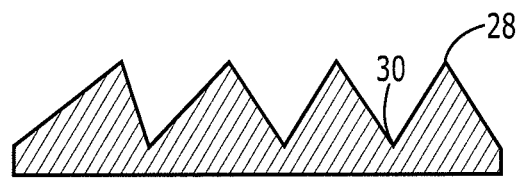
FIGS. 4a-4d are schematic representations of different ridged structures in accordance with embodiments of the present disclosure.
Figure 4B:
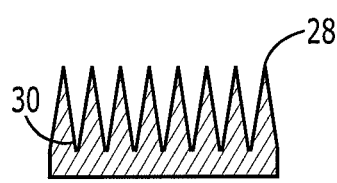
Figure 4C:
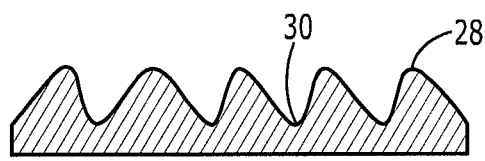
Figure 4D:
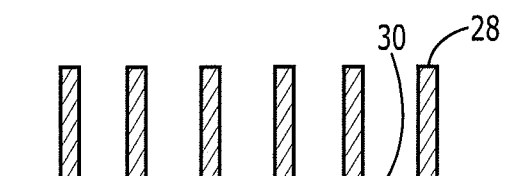

The plurality of ridged structures include a plurality of lengthwise extending, parallel projections 28, e.g., ridges, spaced apart by respective valleys 30. As shown in the illustrated embodiment, the lengthwise extending projection that forms a respective ridged structure may extend continuously in the lengthwise direction for the length of the solar panel 26. The plurality of ridged structures may have a variety of profiles, with four examples of ridged structures depicted in FIGS. 4a-4d. However, the ridged structures may have other profiles in other embodiments. In one embodiment as shown, for example, in FIGS. 4b and 4d, the plurality of ridged structures may be identical in shape, size and spacing. However, in other embodiments, such as shown in FIGS. 4a and 4c, the ridged structures may be different from one another in terms of shape, size, spacing or the like. Although the profile of the ridged structure may differ depending upon a variety of factors including, for example, the anticipated speed of the air vehicle 10, the ridged structure of one embodiment includes projections having a height of between 0.03 mm and 0.07 mm and a center-to-center spacing between the projections of between 0.03 mm and 0.07 mm. In one embodiment, the ridged structure includes projections that have a height that is equal to the center-to-center spacing therebetween.

Although the solar panel 26 is depicted in the embodiment of FIG. 2 to have projections 28 that extend above the remainder of the aerodynamic surface, the solar panel may, instead, be formed within the aerodynamic structure such that the peak of the projections is no higher than the remainder of the aerodynamic surface such that the projections do not protrude beyond or above the remainder of the aerodynamic surface. In instances in which the projections do extend above the remainder of the aerodynamic surface, the leading edge of the solar panel may be curved or may otherwise smoothly transition from the relatively flat surface of the aerodynamic surface that is positioned immediately forward of the solar panel to the ridged structure including the projections that extend thereabove. The valley may be positioned at different relative positions with respect to the remainder of the aerodynamic surface, but, in this embodiment, the nadir of the valleys may be level or contiguous with that portion of the aerodynamic surface that is positioned immediately forward of the solar panel. The aerodynamic structure including the solar panel may be formed in various manners. For example, the aerodynamic structure may be formed with the solar panel built into and integral with the remainder of the aerodynamic structure. Alternatively, the solar panel may be attached to an aerodynamic structure that has been previously constructed, such as by mechanical fasteners, adhesive or the like. Still further, the solar panel of another embodiment may be deposited onto the aerodynamic surface.

The incorporation of the ridged structure along the exterior surface of some of the aerodynamic structure reduces the drag of the air vehicle 10 and correspondingly increases the fuel efficiency of the air vehicle. Although not wishing to be bound by theory, the reduction in the drag that is provided by the ridged structure may be at least partially attributable to the generation of spiraling areas or vortices of fluid that may only contact the peaks of the projections 28 and not the entire exterior surface of an aerodynamic structure so as to reduce friction and permit faster air flow over the aerodynamic structure. Additionally, the alignment of the ridged structure with the anticipated airflow over the aerodynamic structure also serves to constrain the streamlines of the airflow and to limit spanwise interaction between the streamlines that may otherwise increase the resulting drag.

In addition to decreasing the drag of the air vehicle 10, the ridged structures of the solar panel 26 may also improve the harvesting of solar energy by the solar panel relative to a planar solar panel of the same exterior dimensions. In this regard, the ridged structure increases the surface area of the solar panel that is configured to receive solar energy. Additionally, the ridged structure of the solar panel also increases the efficiency with which the solar panel may collect solar energy from light rays that would otherwise impact the solar panel at a relatively low angle, such as shown by the dashed line of FIG. 3 which represents an incident light ray that is reflected and then captured by the solar panel. Further, the texture of the solar panel provided by the ridged structure reduces the reflection of light particles away from the surface of this solar panel and permits additional optical energy to be captured. Once captured, at least a portion of the optical energy may be converted to electrical energy. This electrical energy may, in turn, be utilized to provide power to the air vehicle, either in terms of supplementing the motive power of the air vehicle or providing power for various systems onboard the air vehicle. In either instance, the increased efficiency with which the ridged solar panel of embodiments of the present disclosure collects and converts optical energy further improves the fuel efficiency of the air vehicle. By improving the fuel efficiency of an air vehicle, the fuel costs associated with the air vehicle may be reduced, the payload may be increased for a given fuel load and/or the mission range or mission time may be increased for a given fuel load. Further, the collection of additional solar energy may reduce the reliance upon fossil or other fuels and may assist in the development of an all-electric air vehicle, as well as a hybrid solar powered aircraft that utilizes solar energy to supplement the electrical power required by the aircraft.

Many modifications and other embodiments of the present disclosure will come to mind to one skilled in the art to which these embodiments pertain having the benefit of the teachings presented in the foregoing descriptions and the associated drawings. Therefore, it is to be understood that the present disclosure is not to be limited to the specific embodiments disclosed and that modifications and other embodiments are intended to be included within the scope of the appended claims. For example, although the air vehicle 10 of the illustrated embodiment only includes solar panels on portions of the exterior surface, such as those portions that otherwise experience turbulent flow, other portions of the exterior surface that are illustrated herein as being free of solar panels may include solar panels, although solar panels have a smooth surface as opposed to a ridged surface in order to further increase the solar collection. Thus, those portions of the aerodynamic surfaces that support laminar flow, such as those portions proximate the leading edge may also include solar panels have smooth exterior surfaces in one embodiment. Although specific terms are employed herein, they are used in a generic and descriptive sense only and not for purposes of limitation.

That which is claimed:

1. An air vehicle comprising:
a solar energy harvesting airframe comprising an airfoil and having an exterior surface; and
a solar panel carried by the airframe and defining at least a portion of the exterior surface thereof, wherein the solar panel comprises a plurality of ridged structures having energy absorbing faces extending in a streamwise direction, wherein the ridged structures are arranged such that a majority of air flow over the exterior surface flows in the streamwise direction, wherein the ridged structures are configured such that a respective light ray sequentially impinges upon a plurality of the energy absorbing faces of the ridged structures so as to permit additional solar energy to be captured, and wherein the ridged structures are configured such that the respective light ray initially impinges upon one energy absorbing face and is then reflected to another energy absorbing face.

2. An air vehicle according to claim 1 wherein the ridged structures are arranged such that the streamwise direction is parallel to a predefined air flow direction.

3. An air vehicle according to claim 1 wherein the plurality of ridged structures comprise a plurality of lengthwise extending projections spaced apart by respective valleys.

4. An air vehicle according to claim 3 wherein the plurality of ridged structures are identical.

5. An air vehicle according to claim 1 wherein the airfoil comprises a wing, and wherein the solar panel defines the exterior surface of an upper portion of the wing proximate a trailing edge of the wing.

6. An air vehicle according to claim 1 wherein the airfoil comprises a tail, and wherein the solar panel defines the exterior surface of an upper portion of the tail proximate a trailing edge of the tail.

7. An air vehicle according to claim 1 wherein the airframe comprises a fuselage, and wherein the solar panel defines the exterior surface of an upper portion of the fuselage.

8. An aerodynamic structure comprising:
an aerodynamic surface comprising an airfoil having an exterior surface and configured to support air flow in a predefined air flow direction; and
solar panel defining a portion of the exterior surface of the aerodynamic surface, said solar panel comprising a plurality of ridged structures having energy absorbing faces extending in the predefined air flow direction, wherein the ridged structures are configured such that a respective light ray sequentially impinges upon a plurality of the energy absorbing faces of the ridged structures so as to permit additional solar energy to be captured, and wherein the ridged structures are configured such that the respective light ray initially impinges upon one energy absorbing face and is then reflected to another energy absorbing face.

9. An aerodynamic structure according to claim 8 wherein the plurality of ridged structures comprise a plurality of streamwise extending projections spaced apart by respective valleys.

10. An aerodynamic structure according to claim 9 wherein the plurality of ridged structures are identical.

11. An aerodynamic structure according to claim 9 wherein the airfoil comprises a wing, and wherein the solar panel defines the exterior surface of an upper portion of the wing proximate a trailing edge of the wing.

12. An aerodynamic structure according to claim 9 wherein the airfoil comprises a tail, and wherein the solar panel defines the exterior surface of an upper portion of the tail proximate a trailing edge of the tail.

13. An aerodynamic structure according to claim 8 wherein the aerodynamic structure comprises a fuselage, and wherein the solar panel defines the exterior surface of an upper portion of the fuselage.

14. A method comprising:
providing a solar panel carried by an airframe and defining an exterior surface thereof, wherein providing the solar panel comprises providing a solar panel having a plurality of ridged structures having energy absorbing faces extending in a streamwise direction and arranged such that a majority of air flow over the exterior surface flows in the streamwise direction;
receiving solar energy with the solar panel; and
converting at least some of the solar energy to electrical energy,
wherein providing a solar panel comprise providing a solar panel that is configured such that a respective light ray sequentially impinges upon a plurality of the energy absorbing faces of the ridged structures so as to permit additional solar energy to be captured, wherein providing the solar panel comprises providing the solar panel that is configured such that that the respective light ray initially impinges upon one energy absorbing face and is then reflected to another energy absorbing face.

15. A method according to claim 14 wherein providing the solar panel comprises providing the solar panel having ridged structures arranged such that the streamwise direction is parallel to a predefined air flow direction.

16. A method according to claim 14 wherein providing the solar panel comprises providing the solar panel with the plurality of ridged structures comprising a plurality of streamwise extending projections spaced apart by respective valleys.

17. A method according to claim 16 wherein providing the solar panel further comprises providing the solar panel with a plurality of identical ridged structures.

18. A method according to claim 14 wherein the airfoil comprises a wing, and wherein providing the solar panel comprises providing the solar panel so as to define the exterior surface of an upper portion of the wing proximate a trailing edge of the wing.

19. A method according to claim 14 wherein the airfoil comprises a tail, and wherein providing the solar panel comprises providing the solar panel so as to define the exterior surface of an upper portion of the tail proximate a trailing edge of the tail.

20. A method according to claim 14 wherein the airframe comprises a fuselage, and wherein providing the solar panel comprises providing the solar panel so as to define the exterior surface of an upper portion of the fuselage.

21. An air vehicle according to claim 1 wherein the solar panel is disposed within the airfoil such that a peak of the ridged structures is no higher than a remainder of the airfoil.

22. An aerodynamic structure according to claim 8 wherein the solar panel is disposed within the aerodynamic surface such that a peak of the ridged structures is no higher than a remainder of the aerodynamic surface.

23. A method according to claim 14 wherein the solar panel is disposed within the airfoil such that a peak of the ridged structures is no higher than a remainder of the airfoil.

24. An air vehicle according to claim 1 wherein the solar panel including the plurality of ridged structures defines up to 50% of the exterior surface of the airfoil.

25. An aerodynamic structure according to claim 8 wherein the solar panel including the plurality of ridged structures defines up to 50% of the exterior surface of the airfoil.

26. A method according to claim 14 wherein the solar panel including the plurality of ridged structures defines up to 50% of the exterior surface of the airfoil.

\* \* \* \* \*